(12) United States Patent
Whitcomb

(10) Patent No.: US 8,764,878 B2
(45) Date of Patent: Jul. 1, 2014

(54) COPPER NANOWIRE PREPARATION METHODS AND COMPOSITIONS

(71) Applicant: David R. Whitcomb, Woodbury, MN (US)

(72) Inventor: David R. Whitcomb, Woodbury, MN (US)

(*) Notice: Subject to any disclaimer, the term of this patent is extended or adjusted under 35 U.S.C. 154(b) by 3 days.

(21) Appl. No.: 13/764,820

(22) Filed: Feb. 12, 2013

(65) Prior Publication Data

US 2013/0230737 A1    Sep. 5, 2013

Related U.S. Application Data

(60) Provisional application No. 61/606,672, filed on Mar. 5, 2012.

(51) Int. Cl.
| | | |
|---|---|---|
| *C22B 15/00* | (2006.01) | |
| *B22F 1/00* | (2006.01) | |
| *B22F 9/24* | (2006.01) | |
| *B22F 9/16* | (2006.01) | |
| *C30B 7/14* | (2006.01) | |
| *C30B 29/62* | (2006.01) | |

(52) U.S. Cl.
CPC .............. *B22F 9/16* (2013.01); *B22F 1/0025* (2013.01); *B22F 2301/10* (2013.01); *B22F 9/24* (2013.01); *C30B 7/14* (2013.01); *C30B 29/62* (2013.01); *Y10S 977/762* (2013.01)
USPC .............................. 75/370; 75/373; 977/762

(58) Field of Classification Search
CPC  C22B 15/0089; B22F 9/24; B22F 2001/0018
USPC ..................... 75/370, 373; 977/762
See application file for complete search history.

(56) References Cited

U.S. PATENT DOCUMENTS

| | | |
|---|---|---|
| 7,922,787 B2 | 4/2011 | Wang et al. |
| 2010/0078197 A1 | 4/2010 | Miyagishima |

FOREIGN PATENT DOCUMENTS

| | | |
|---|---|---|
| KR | 2010 0079781 | 7/2010 |
| WO | WO2012/161894 | 11/2012 |

OTHER PUBLICATIONS

Xu S et al: Selective synthesis of copper nanoplates and nanowires via a surfactant-assisted hydrothermal process. Materials Chemistry and Physics, Elsevier, SA, Switzerland, Taiwan, Republic of China, vol. 120, No. 1, Mar. 15, 2010 , pp. 1-5.
International Search Report, completed Jun. 24, 2013 for International Application No. PCT/US2013/025810, 4 pages.
Y. Xia et al., Shape-Controlled Synthesis of Metal Nanocrystals: Simple Chemistry Meets Complex Physics, Angew. Chem. Int. Ed., 2009, vol. 48, pp. 60-103.
A. Rathmell et al., The Synthesis and Coating of Long, Thin Copper Nanowires to Make Flexible, Transparent Conducting Films on Plastic Substrates, Adv. Mater, 2001, pp. 1-6.
A. Rathmell et al., The Growth Mechanism of Copper Nanowires and their Properties in Flexible, Transparent Conducting Films, Adv. Mater, 2010, vol. 22, pp. 3558-3562.
B. Wiley, Solution-Coatable Transparent Conductive Films of Copper Nanowires, 2012Flex, Flexible Electronics & Displays Conference & Exhibition, Feb. 2012, 32 pages.
Y Chang et al., Large-Scale Synthesis of High-Quality Ultralong Copper Nanowires, Langmuir, 2005, vol. 21, pp. 3746-3748.
M. Figlarz et al., Preparation and Characterization of Monodisperse Co, Ni, Cu, and Ag Metal Particles of Uniform Shape, Adv. Powder Metallury & Particulate Metals, 1992, vol. 1, pp. 179-192.

*Primary Examiner* — George Wyszomierski
*Assistant Examiner* — Tima M McGuthry Banks
(74) *Attorney, Agent, or Firm* — Reed L. Christiansen

(57) ABSTRACT

Claimed methods do not rely on highly reactive reagents, highly corrosive solutions, high temperatures, or long reaction times. Nanowires produced from such methods are free of large attached nanoparticles that have accompanied previously disclosed copper nanowires. Such nanowires are useful for electronics applications.

16 Claims, 4 Drawing Sheets

COPPER NANOWIRE PREPARATION METHODS AND COMPOSITIONS

CROSS REFERENCE TO RELATED APPLICATIONS

This application claims the benefit of U.S. Provisional Patent Application No. 61/606,672, filed Mar. 5, 2012, entitled COPPER NANOWIRE PREPARATION METHODS AND COMPOSITIONS, which is hereby incorporated by reference in its entirety.

BACKGROUND

Methods for preparing copper nanowires from solution have been reported. See, for example, M. Figlarz; C. Ducamp-Sanguesa; F. Flievet; J. P. Lagier, *Adv. Powder Metallurgy & Particulate Metals,* 1992, 1, 179-92; Y. Chang, M. L Lye, and H. C. Zeng, *Langmuir,* 2005, 21, 3746; Y. Xia, Y. Xiong, B. Lim, S. E. Skrabalak, *Angew. Chem. Int. Ed.,* 2009, 48, 60; A. R. Rathmell, S. M. Bergin, Y-L Hua, Z-Y Li, and B. J. Wiley, *Adv. Mater.,* 2010, 22, 3558; A. R. Rathmell and B. J. Wiley, *Adv. Mater.,* 2011, 23, 4798; and B. J. Wiley, "Solution-Coatable Transparent Conductive Films of Copper Nanowires," presentation at 2012FLEX Flexible Electronics & Displays Conference & Exhibition, February 2012, each of which is hereby incorporated by reference in its entirety. Such methods can employ highly reactive reagents, such as hydrazine, and highly corrosive solutions, such as concentrated NaOH solutions. The nanowires produced from such methods have been reported to have large attached nanoparticles.

The applicant has discovered methods for readily preparing copper nanowires without resorting to highly reactive reagents, highly corrosive solutions, high temperatures, or long reaction times. Nanowires produced from such methods are free of large attached nanoparticles and are therefore expected to be more suitable for solution coating in electronics applications than previously disclosed copper nanowires.

Because of the relative abundance and lower cost of copper relative to silver, such improved methods may allow substitution of superior morphology copper nanowires in applications that currently rely on silver nanowires.

SUMMARY

At least some embodiments provide methods comprising providing at least one first compound capable of forming at least one halide ion, and reducing the at least one copper compound to a least one copper metal nanowire in the presence of at least one or the at least one first compound or the at least one halide ion.

In some embodiments, the at least one first compound comprises at least one atom comprising at least one of a boron atom, a nitrogen atom, a phosphorus atom a silicon atom, a sulfur atom a selenium atom or a carbon atom. The at least one atom may, in some cases, be bonded to at least one carbon atom, such, for example, in the case where the at least one atom is bonded to at least one aromatic ring. An exemplary first compound is triphenylphosphonium chloride.

Some embodiments provide the at least one copper metal nanowire produced according to such methods. In at least some cases, such copper nanowires comprise at least a first nanowire end and at least a second nanowire end, where neither the first nanowire end nor the second nanowire end is attached to nanoparticles. In some cases, such copper metal nanowires may comprise a smallest dimension between about 10 nm and about 300 nm, or a largest dimension between about 5 µm and about 50 µm, or a largest dimension greater than about 10 µm and a smallest dimension less than about 90 nm. Such copper nanowires may, for example, comprise an aspect ratio of at least about 50.

In at least some cases, the reduction in such methods may be carried out for less than about 90 min, or less than about 60 min, or at a temperature less than about 190° C., or at a temperature less than about 160° C. Such a reduction may, in at least some cases, be carried out in the presence of at least one polyol, such as, for example, propylene glycol. Such a reduction may, in at least some cases, be carried out in the presence of at least one protecting agent, such as, for example, polyvinylpyrrolidone.

Other embodiments provide compositions comprising at least one copper nanowire comprising at least a first nanowire end and at least a second nanowire end, where neither the first nanowire end nor the second nanowire end is attached to nanoparticles. In some cases, the at least one copper metal nanowire may comprise a smallest dimension between about 10 nm and about 300 nm, or a largest dimension between about 5 µm and about 50 µm, or a largest dimension greater than about 10 µm and a smallest dimension less than about 90 nm. Such copper nanowires may, for example, comprise an aspect ratio of at least about 50.

These embodiments and other variations and modifications may be better understood from the brief description of figures, description, exemplary embodiments, examples, figures, and claims that follow. Any embodiments provided are given only by way of illustrative example. Other desirable objectives and advantages inherently achieved may occur or become apparent to those skilled in the art. The invention is defined by the patented claims.

DESCRIPTION

Figure 1:
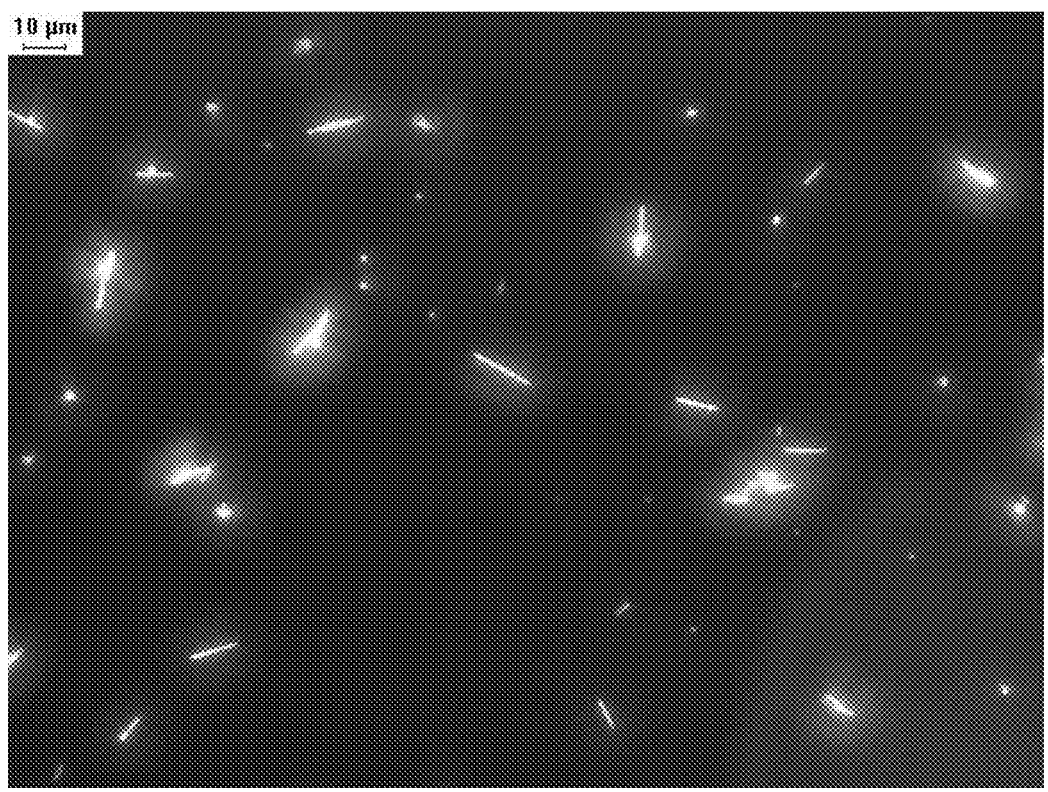
FIG. 1 shows an optical micrograph of the copper nanowire product of Example 1.

All publications, patents, and patent documents referred to in this application are incorporated by reference herein in their entirety, as though individually incorporated by reference.

U.S. Provisional Patent Application No. 61/606,672, filed Mar. 5, 2012, entitled COPPER NANOWIRE PREPARATION METHODS AND COMPOSITIONS, is hereby incorporated by reference in its entirety.

Preparation Methods

A common method of preparing nanostructures, such as, for example, nanowires, is the "polyol" process. Such a process is described in, for example, *Angew. Chem. Int. Ed.* 2009, 48, 60, Y. Xia, Y. Xiong, B. Lim, S. E. Skrabalak, which is hereby incorporated by reference in its entirety. Such processes typically reduce a metal cation, such as, for example, a silver cation, to the desired metal nanostructure product, such as, for example, a silver nanowire. Such a reduction may be carried out in a reaction mixture that may, for example, comprise one or more polyols, such as, for example, ethylene glycol (EG), propylene glycol, butanediol, glycerol, sugars, carbohydrates, and the like; one or more protecting agents, such as, for example, polyvinylpyrrolidinone (also known as polyvinylpyrrolidone or PVP), other polar polymers or copolymers, surfactants, acids, and the like; and one or more metal ions. These and other components may be used in such reaction mixtures, as is known in the art. The reduction may, for example, be carried out at one or more temperatures from about 80° C. to about 190° C.

Methods for preparing copper nanowires from solution have been reported. See, for example, Y. Xia, Y. Xiong, B. Lim, S. E. Skrabalak, *Angew. Chem. Int. Ed.* 2009, 48, 60; Y. Chang, M. L Lye, and H. C. Zeng, *Langmuir*, 2005, 21, 3746; A. R. Rathmell, S. M. Bergin, Y-L Hua, Z-Y Li, and B. J. Wiley, *Adv. Mater.*, 2010, 22, 3558; A. R. Rathmell and B. J. Wiley, *Adv. Mater.*, 2011, 23, 4798; and B. J. Wiley, "Solution-Coatable Transparent Conductive Films of Copper Nanowires," presentation at 2012FLEX Flexible Electronics & Displays Conference & Exhibition, February 2012, each of which is hereby incorporated by reference in its entirety. Such methods can employ highly reactive reagents, such as hydrazine, and highly corrosive solutions, such as concentrated NaOH solutions. The nanowires produced from such methods have been reported to have large attached nanoparticles.

The applicant has discovered methods for readily preparing copper nanowires without resorting to highly reactive reagents, highly corrosive solutions, high temperatures, or long reaction times. Nanowires produced from such methods are free of large attached nanoparticles and are therefore expected to be more suitable for solution coating in electronics applications than previously disclosed copper nanowires.

Because of the relative abundance and lower cost of copper relative to silver, such improved methods may allow substitution of superior morphology copper nanowires in applications that currently rely on silver nanowires.

At least some embodiments provide methods comprising providing at least one first compound capable of forming at least one halide ion, and reducing the at least one copper compound to a least one copper metal nanowire in the presence of at least one or the at least one first compound or the at least one halide ion.

In some embodiments, the at least one first compound comprises at least one atom comprising at least one of a boron atom, a nitrogen atom, a phosphorus atom a silicon atom, a sulfur atom a selenium atom or a carbon atom. The at least one atom may, in some cases, be bonded to at least one carbon atom, such, for example, in the case where the at least one atom is bonded to at least one aromatic ring. An exemplary first compound is triphenylphosphonium chloride.

Some embodiments provide the at least one copper metal nanowire produced according to such methods. In at least some cases, such copper nanowires comprise at least a first nanowire end and at least a second nanowire end, where neither the first nanowire end nor the second nanowire end is attached to nanoparticles. In some cases, such copper metal nanowires may comprise a smallest dimension between about 10 nm and about 300 nm, or a largest dimension between about 5 µm and about 50 µm, or a largest dimension greater than about 10 µm and a smallest dimension less than about 90 nm. Such copper nanowires may, for example, comprise an aspect ratio of at least about 50.

In at least some cases, the reduction in such methods may be carried out for less than about 90 min, or less than about 60 min, or at a temperature less than about 190° C., or at a temperature less than about 160° C. Such a reduction may, in at least some cases, be carried out in the presence of at least one polyol, such as, for example, propylene glycol. Such a reduction may, in at least some cases, be carried out in the presence of at least one protecting agent, such as, for example, polyvinylpyrrolidone.

Protecting Agents

Protecting agents are known. Protecting agents are also sometimes referred to by such terms as organic protective agents, protective agents, or capping agents. U.S. Pat. No. 7,922,787 to Wang et al., which is hereby incorporated by reference in its entirety, provides an overview of such references.

For the purpose of this application, protecting agents are compounds that are capable of being absorbed onto a metallic surface, such as, for example, the surface of a metal nanoparticle or metal nanowire. When the metallic surface is that of silver, polyvinylpyrrolidone is commonly used as a protecting agent. However, other compounds are also capable of functioning as protecting agents. For example, other compounds that are capable of interacting electronically with metals, such as compounds containing atoms with one or more free electron pairs, may be able to function as protecting agents. Such atoms include oxygen, sulfur, and nitrogen; they may appear in a variety of functional groups within the protecting agent. Non-limiting examples of such compounds include polyvinyl alcohol, sodium dodecyl sulfate, laurylamine, hydroxypropyl cellulose, and copolymers containing vinyl pyrrolidone moieties. Other non-limiting examples of such compounds include copolymers containing ethylene and ethylene glycol moieties, copolymers containing ethylene and vinyl pyrrolidone moieties, copolymers containing ethylene and vinyl pyridine moieties, copolymers containing vinyl chloride and ethylene glycol moieties, copolymers containing vinyl chloride and vinyl pyrrolidone moieties, copolymers containing vinyl chloride and vinyl pyridine moieties, copolymers containing vinyl acetate and ethylene glycol moieties, copolymers containing vinyl acetate and vinyl pyrrolidone moieties, copolymer containing vinyl acetate and vinyl pyridine moieties, copolymers containing styrene and ethylene glycol moieties, copolymers containing styrene and vinyl pyrrolidone moieties, and copolymer containing styrene and vinyl pyridine moieties. These and other protecting agents will be understood by those skilled in the art.

Nanostructures and Nanowires

In some embodiments, the metal product formed by such methods is a nanostructure, such as, for example, a one-dimensional nanostructure. Nanostructures are structures having at least one "nanoscale" dimension less than 300 nm, and at least one other dimension being much larger than the nanoscale dimension, such as, for example, at least about 10, or at least about 50, or at least about 100, or at least about 200, or at least about 1000 times larger. Examples of such nanostructures are nanorods, nanowires, nanotubes, nanopyramids, nanoprisms, nanoplates, nanorings, and the like. "One-dimensional" nanostructures have one dimension that is much larger than the other two dimensions, such as, for example, at least about 10 or at least about 100 or at least about 200 or at least about 1000 times larger.

Such one-dimensional nanostructures may, in some cases, comprise nanowires. Nanowires are one-dimensional nanostructures in which the two short dimensions (the thickness dimensions) are less than 300 nm, preferably less than 100 nm, while the third dimension (the length dimension) is greater than 1 micron, preferably greater than 10 microns, and the aspect ratio (ratio of the length dimension to the larger of the two thickness dimensions) is greater than five. Nanowires are being employed as conductors in electronic devices or as elements in optical devices, among other possible uses.

Some embodiments provide compositions comprising at least one copper nanowire comprising at least a first nanowire end and at least a second nanowire end, where neither the first nanowire end nor the second nanowire end is attached to nanoparticles. In some cases, the at least one copper metal nanowire may comprise a smallest dimension between about 10 nm and about 300 nm, or a largest dimension between about 5 µm and about 50 µm, or a largest dimension greater than about 10 µm and a smallest dimension less than about 90 nm. Such copper nanowires may, for example, comprise an aspect ratio of at least about 50.

Nanowires and other nanostructure products may be incorporated into articles, such as, for example, electronic displays, touch screens, portable telephones, cellular telephones, computer displays, laptop computers, tablet computers, point-of-purchase kiosks, music players, televisions, electronic games, electronic book readers, transparent electrodes, solar cells, light emitting diodes, other electronic devices, medical imaging devices, medical imaging media, and the like.

EXEMPLARY EMBODIMENTS

U.S. Provisional Patent Application No. 61/606,672, filed Mar. 5, 2012, entitled COPPER NANOWIRE PREPARATION METHODS AND COMPOSITIONS, which is hereby incorporated by reference in its entirety, disclosed the following 25 non-limiting exemplary embodiments:

A. A method comprising:
  providing at least one first compound capable of forming at least one halide ion; and
  reducing at least one copper ion to at least one copper metal nanowire in the presence of at least one of the at least one first compound or the at least one halide ion.
B. The method according to embodiment A, wherein the at least one first halide ion comprises at least one chloride ion.
C. The method according to embodiment A, wherein the at least one first compound comprises at least one atom comprising at least one of a boron atom, a nitrogen atom, a phosphorus atom, a silicon atom, a sulfur atom, a selenium atom, or a carbon atom.
D. The method according to embodiment C, wherein the at least one atom is bonded to at least one carbon atom.
E. The method according to embodiment C, wherein the at least one atom is bonded to at least one aromatic ring.
F. The method according to embodiment A, wherein the at least one first compound comprises triphenylphosphonium chloride.
G. The copper metal nanowire produced by the method according to embodiment A.
H. The copper metal nanowire according to embodiment G, comprising a first nanowire end and a second nanowire end, wherein the first nanowire end is not attached to any nanoparticles and the second nanowire end is not attached to any nanoparticles.
J. The copper metal nanowire according to embodiment G, comprising a smallest dimension between about 10 nm and about 300 nm.
K. The copper metal nanowire according to embodiment G, comprising a largest dimension between about 5 µm and about 50 µm.
L. The copper metal nanowire according to embodiment G, comprising a largest dimension greater than about 10 µm and a smallest dimension less than about 90 nm.
M. The copper metal nanowire according to embodiment G, comprising an aspect ratio of at least about 50.
N. The method according to embodiment A, wherein the reduction is performed for less than about 90 min.
P. The method according to embodiment A, wherein the reduction is performed for less than about 60 min.
Q. The method according to embodiment A, wherein the reduction is performed at a temperature less than about 190° C.
R. The method according to embodiment A, wherein the reduction is performed at a temperature less than about 160° C.
S. The method according to embodiment A, wherein the reduction is performed in the presence of at least one polyol.
T. The method according to embodiment A, wherein the reduction is performed in the presence of propylene glycol.
U. The method according to embodiment A, wherein the reduction is performed in the presence of at least one protecting agent.
V. The method according to embodiment A, wherein the reduction is performed in the presence of polyvinylpyrrolidone.
W. A composition comprising at least one copper metal nanowire comprising a first nanowire end and a second nanowire end, wherein the first nanowire end is not attached to any nanoparticles and the second nanowire end is not attached to any nanoparticles.
X. The composition according to embodiment W, wherein the at least one copper metal nanowire comprises a smallest dimension between about 10 nm and about 300 nm.
Y. The composition according to embodiment W, wherein the at least one copper metal nanowire comprises a largest dimension between about 5 µm and 50 µm.
Z. The composition according to embodiment W, wherein the at least one copper metal nanowire comprises a largest dimension greater than about 10 µm and a smallest dimension less than about 90 nm.
AA. The composition according to embodiment W, wherein the at least one copper metal nanowire comprises an aspect ratio of at least about 50.

EXAMPLES

Example 1

A 100 mL reaction flask containing 60 mL propylene glycol (PG) and 1.3 g of polyvinylpyrrolidone (PVP, 55,000 molecular weight) was stripped of at least some dissolved gases by bubbling nitrogen into the solution for 30 min using a glass pipette at room temperature with mechanical stirring while at 100 rpm. This reaction mixture was heated to 145° C. under nitrogen. During this heating, a solution was prepared consisting of 0.93 g $Cu(NO_3)_2 \cdot 4H_2O$ and 35 mg of tetraphenylphosphonium chloride in 22 mL PG. Ten minutes after the reaction mixture reached 145° C., 20 mL of this solution was added to the reaction mixture at a constant rate over 25 minutes via a 12 gauge TEFLON® fluoropolymer syringe needle. Within 30 minutes after addition of this solution, the reaction mixture attained a copper-colored silky appearance.

Figure 2:
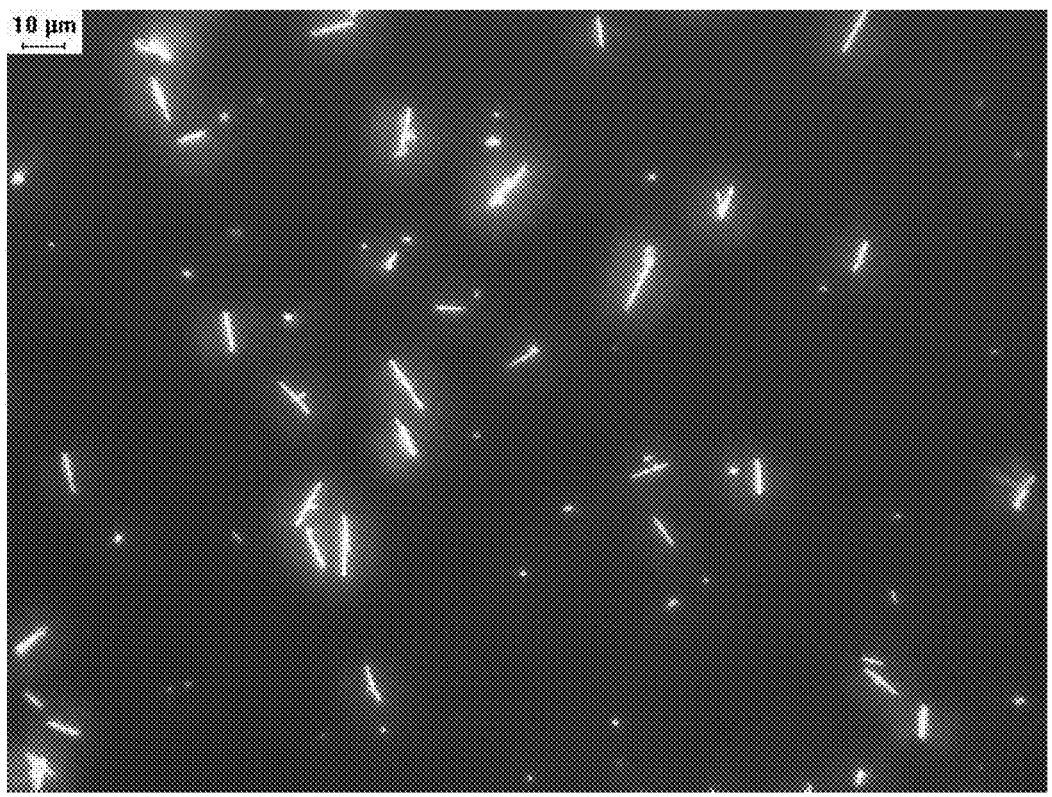
FIG. 2 shows an optical micrograph of the copper nanowire product of Example 1.
Figure 3:
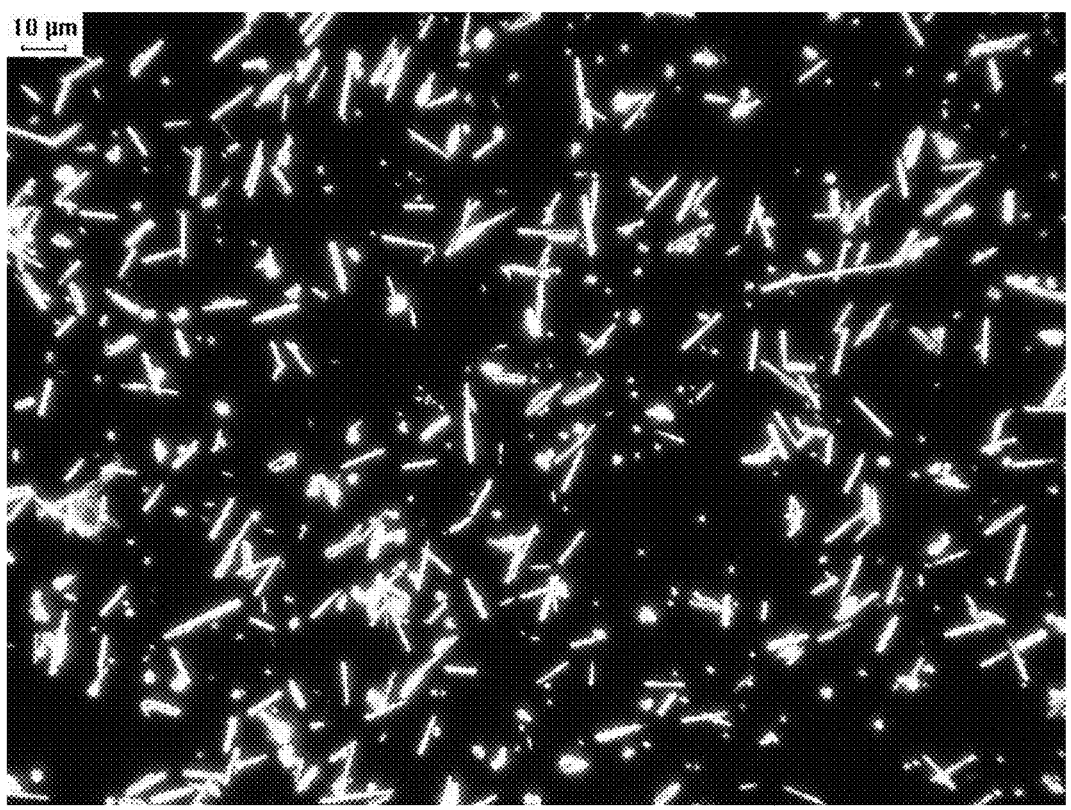
FIG. 3 shows an optical micrograph of the copper nanowire product of Example 1.
Figure 4:
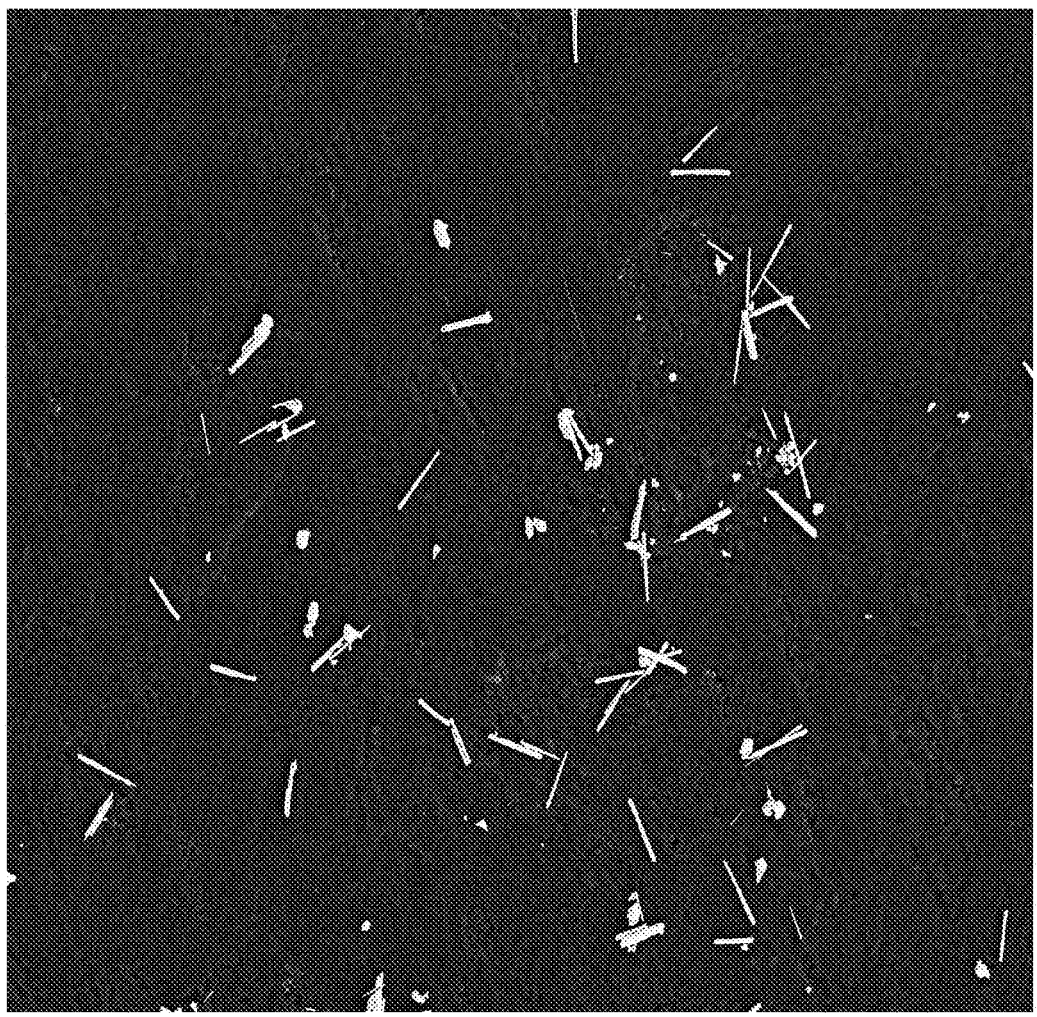
FIG. 4 shows a scanning electron micrograph of the copper nanowire product of Example 1.

Optical micrographs of the product copper nanowires are shown in FIGS. 1, 2, and 3, with lengths of some wires being greater than or equal to about 10 µm. A scanning electron micrograph of this product is shown in FIG. 4, which shows the absence of any large nanoparticles attached to the copper nanowire ends.

Example 2

Comparative

A 100 mL reaction flask containing 60 mL PG and 1.3 g of PVP was stripped of at least some dissolved gases by bubbling nitrogen into the solution for 30 min using a glass pipette at room temperature with mechanical stirring while at 100 rpm. This reaction mixture was heated to 145° C. under nitrogen. During this heating, a solution was prepared consisting of 0.83 g $Cu(NO_3)_2.4H_2O$ in 24 mL PG. Ten minutes after the reaction mixture reached 145° C., the 20 mL of this solution was added to the reaction mixture at a constant rate over 25 minutes via a 12 gauge TEFLON® fluoropolymer syringe needle.

30 min after addition of this solution, the dispersion was light yellow and contained only particles. 1 hr after the addition, the dispersion was mustard colored and contained particles and organic solids. At 2 hrs and 3 hrs after the addition, there were no obvious changes. 4 hrs after the addition, there appeared to be a sea of small particles with some larger microparticle aggregates. 20 hrs after the addition, the dispersion was copper colored, consisting mostly of copper nanoparticles and macroparticle aggregates.

Example 3

Comparative

A 100 mL reaction flask containing 50 mL ethylene glycol (EG) and was stripped of at least some dissolved gases by bubbling argon into the solution for at least two hours using a glass pipette at room temperature with mechanical stirring while at 100 rpm. 0.15 g of a 0.13M solution of NaCl in EG was added to the reaction flask. This reaction mixture was heated to 145° C. under argon. During this heating, two TEFLON® fluoropolymer syringe needles were filled with two solutions. The first was a degassed solution of 0.37 g polyvinylpyrrolidone (PVP, 55,000 molecular weight) in 11 g EG, and the second was a degassed solution of 0.28 g $Cu(NO_3)_2.4H_2O$ in 11 g EG. After the reaction mixture reached 145° C., these two solutions were added by syringe to the reaction mixture at a constant rate over 20 min.

The reaction mixture was held at temperature for 90 minutes after completion of the addition of the two solutions. The resulting coppery red reaction mixture contained copper particles having diameters greater than about 1 μm, with no copper nanowires being present.

Example 4

Comparative

A 100 mL reaction flask containing 70 mL propylene glycol (PG) and 0.56 g of polyvinylpyrrolidone (PVP, 55,000 molecular weight) was stripped of at least some dissolved gases by bubbling nitrogen into the solution for 30 min using a glass pipette at room temperature with mechanical stirring while at 100 rpm. This reaction mixture was heated to 145° C. under nitrogen. During this heating, a solution was prepared consisting of 1.43 g $Ni(NO_3)_2.6H_2O$, 2.5 mL of 35 mM tetraphenylphosphonium chloride in PG, and 8.5 mL PG. After the reaction mixture reached 145° C., this solution was added to the reaction mixture at a constant rate of 0.5 mL/min via a 12 gauge TEFLON® fluoropolymer syringe needle. No solids of any type were formed after 3 hours of reaction.

Example 5

Comparative

A 100 mL reaction flask containing 70 mL propylene glycol (PG) and 0.87 g of polyvinylpyrrolidone (PVP, 55,000 molecular weight) was stripped of at least some dissolved gases by bubbling nitrogen into the solution for 30 min using a glass pipette at room temperature with mechanical stirring while at 100 rpm. This reaction mixture was heated to 145° C. under nitrogen. During this heating, a solution was prepared consisting of 1.34 g $Co(NO_3)_2.6H_2O$, 2.7 mL of 35 mM tetraphenylphosphonium chloride in PG, and 8.3 mL PG. After the reaction mixture reached 145° C., this solution was added to the reaction mixture at a constant rate of 0.5 mL/min via a 12 gauge TEFLON® fluoropolymer syringe needle. No solids of any type were formed after 4 hours of reaction.

The invention has been described in detail with reference to particular embodiments, but it will be understood that variations and modifications can be effected within the spirit and scope of the invention. The presently disclosed embodiments are therefore considered in all respects to be illustrative and not restrictive. The scope of the invention is indicated by the patented claims, and all changes that come within the meaning and range of equivalents thereof are intended to be embraced therein.

What is claimed:

1. A method comprising:
   providing at least one first compound capable of forming at least one halide ion, said first compound comprising at least one atom selected from a boron atom, a nitrogen atom, a phosphorus atom, a silicon atom, a sulfur atom, a selenium atom, or a carbon atom, the at least one atom being bonded to at least one aromatic ring; and
   reducing at least one copper ion to at least one copper metal nanowire in the presence of at least one of the at least one first compound or the at least one halide ion formed from the first compound.

2. The method according to claim 1, wherein the at least one halide ion comprises at least one chloride ion.

3. The method according to claim 1, wherein the at least one first compound comprises triphenylphosphonium chloride.

4. The copper metal nanowire produced by the method according to claim 1, comprising a first nanowire end and a second nanowire end, wherein the first nanowire end is not attached to any nanoparticles and the second nanowire end is not attached to any nanoparticles.

5. The copper metal nanowire according to claim 4, comprising a smallest dimension between about 10 nm and about 300 nm.

6. The copper metal nanowire according to claim 4, comprising a largest dimension between about 5 μm and about 50 μm.

7. The copper metal nanowire according to claim 4, comprising a largest dimension greater than about 10 μm and a smallest dimension less than about 90 nm.

8. The copper metal nanowire according to claim 4, comprising an aspect ratio of at least about 50.

9. The method according to claim 1, wherein the reduction is performed for less than about 90 min.

10. The method according to claim 1, wherein the reduction is performed for less than about 60 min.

11. The method according to claim 1, wherein the reduction is performed at a temperature less than about 190° C.

12. The method according to claim 1, wherein the reduction is performed at a temperature less than about 160° C.

13. The method according to claim 1, wherein the reduction is performed in the presence of at least one polyol.

14. The method according to claim 1, wherein the reduction is performed in the presence of propylene glycol.

15. The method according to claim 1, wherein the reduction is performed in the presence of at least one protecting agent.

16. The method according to claim 1, wherein the reduction is performed in the presence of polyvinylpyrrolidone.

* * * * *